(12) United States Patent
Hajime et al.

(10) Patent No.: US 10,434,686 B2
(45) Date of Patent: Oct. 8, 2019

(54) THREE-DIMENSIONAL ARTICLE AND METHOD OF MAKING THE SAME

(71) Applicant: 3M INNOVATIVE PROPERTIES COMPANY, St. Paul, MN (US)

(72) Inventors: Evan Koon Lun Yuuji Hajime, Woodbury, MN (US); Jason D. Clapper, Lino Lakes, MN (US); Kurt J. Halverson, Lake Elmo, MN (US); Myungchan Kang, Woodbury, MN (US)

(73) Assignee: 3M Innovative Properties Company, St. Paul, MN (US)

( * ) Notice: Subject to any disclaimer, the term of this patent is extended or adjusted under 35 U.S.C. 154(b) by 0 days.

(21) Appl. No.: 16/061,828

(22) PCT Filed: Dec. 20, 2016

(86) PCT No.: PCT/US2016/067713
§ 371 (c)(1),
(2) Date: Jun. 13, 2018

(87) PCT Pub. No.: WO2017/116836
PCT Pub. Date: Jul. 6, 2017

(65) Prior Publication Data
US 2018/0370084 A1    Dec. 27, 2018

Related U.S. Application Data

(60) Provisional application No. 62/271,712, filed on Dec. 28, 2015.

(51) Int. Cl.
*B29C 35/02*    (2006.01)
*B29C 59/16*    (2006.01)
(Continued)

(52) U.S. Cl.
CPC ...... *B29C 35/0266* (2013.01); *B29C 35/0805* (2013.01); *B29C 59/16* (2013.01);
(Continued)

(58) Field of Classification Search
CPC ..... B29C 59/16; B29C 71/04; B29C 35/0266; B29C 35/0866; B29C 35/0805;
(Continued)

(56) References Cited

U.S. PATENT DOCUMENTS 6,340,532 B1    1/2002   Huang
9,902,107 B2*   2/2018   Buehring ............ B29C 35/0266
(Continued)

FOREIGN PATENT DOCUMENTS

CA    2505586    10/2006
DE    19946252   4/2001
(Continued)

OTHER PUBLICATIONS

"Polyethylene—High density (HDPE), Material Information", Goodfellow Corporation, Coraopolis, PA, USA [online], [retrieved from the internet on Aug. 17, 2018], URL < http://www.goodfellow.com/E/Polyethylene-High-density.html >, 2 pages.
(Continued)

*Primary Examiner* — Catherine A. Simone

(57) ABSTRACT

Three-dimensional polymeric article (100) having first (101) and second (102) opposed major surfaces, a first dimension perpendicular to a second dimension, a thickness orthogonal to the first and second dimensions, and a plurality of alternating first (107) and second (109) polymeric regions along the first or second dimensions, wherein the first (107) and second (108) regions extend at least partially across the second dimension, wherein the first regions (107) are in a common plane (115) and wherein some of the second regions (108) project outwardly from the plane (115) in a
(Continued)

first direction (generally perpendicular from the plane), and some of the second regions (108) project outwardly from the plane (115) in a second direction that is generally 180 degrees from the first direction, where the first regions (107) have a first crosslink density, wherein the second regions (108) have a second crosslink density, and wherein the second crosslink density of the second regions (108) are less than the first crosslink density of the first regions (107). Embodiments of the articles are useful for example, for providing a dual-sided, textured wrapping film such that greater grip is realized both on an item wrapped by the film and the wrapped item itself.

8 Claims, 17 Drawing Sheets

(51) Int. Cl.
*B29C 59/18* (2006.01)
*B29C 61/02* (2006.01)
*B29C 35/08* (2006.01)
*B29C 71/04* (2006.01)

(52) U.S. Cl.
CPC .............. *B29C 59/18* (2013.01); *B29C 61/02* (2013.01); *B29C 71/04* (2013.01); *B29C 2035/085* (2013.01); *B29C 2035/0827* (2013.01); *B29C 2035/0844* (2013.01); *B29C 2035/0877* (2013.01); *B81C 2201/0154* (2013.01)

(58) Field of Classification Search
CPC ............. B29C 2035/0877; B29C 61/02; Y10T 428/24479; Y10T 428/24595; B32B 3/00; B32B 3/28; B32B 3/30; B29K 2105/24; B29K 2105/243

USPC .................................................. 428/156, 170
See application file for complete search history.

(56) References Cited

U.S. PATENT DOCUMENTS

2005/0191439 A1   9/2005   Hirose
2013/0075959 A1   3/2013   Ohya
2018/0162078 A1   6/2018   Hajime

FOREIGN PATENT DOCUMENTS

EP              2684677        6/2015
JP              59192530       10/1984
WO       WO 2017/116835       7/2017

OTHER PUBLICATIONS

Hearon, "Post-Polymerization Crosslinked Polyurethane Shape Memory Polymers", Journal Applied Polymer Science, 2011, vol. 121, No. 1, pp. 144-153.
Orwoll, Chapter 14, "Polymer-Solvent Interaction Parameter $\chi$", Table 14.1, *Physical Properties of Polymers Handbook*, Ed. Mark, AIP Press, American Institute of Physics, Woodbury, New York, 1996, pp. 177-196.
Young, "Roark's Formulas for Stress and Strain", $7^{th}$ Edition, McGraw-Hill Professional, New York, NY, 2001, p. 734, Table 15.2 (9 pages).
International Search Report for PCT International Application No. PCT/US2016/067713, dated Mar. 30, 2017, 6 pages.

\* cited by examiner

THREE-DIMENSIONAL ARTICLE AND METHOD OF MAKING THE SAME

CROSS REFERENCE TO RELATED APPLICATIONS

This application is a national stage filing under 35 U.S.C. 371 of PCT/US2016/067713, filed Dec. 20, 2016, which claims the benefit of U.S. Provisional Application No. 62/271,712, filed Dec. 28, 2015, the disclosure of which is incorporated by reference in its/their entirety herein.

BACKGROUND

Microstructured films, with features on the micrometer scale, have been used in a variety of technologies including overhead projector films, reflective signage, and abrasive films. Common microstructure forming processes include extrusion, embossing, and lithography (e.g., photolithography). Lithographic processes often require complex optics, relatively low throughput, and multiple processing steps, including solution based processing which may generate significant amounts of liquid waste. Microreplication processes such as extrusion and hot embossing typically require expensive master pattern rolls for any given pattern, and any changes to the pattern would require the added expense of a new master to be fabricated. In addition, the patterns are limited in both feature depth and type of pattern (e.g., based on diamond turning methods). In addition, the microreplication processes generally produce materials having a base plane (sometimes referred to as the "land" area) with patterns protruding either all above or all below the base plane. Precise registration of microstructured patterns on opposing sides of a film may allow for simultaneous features both above and below the base plane, however these processes are significantly more complex and often have additional limitations on precision of feature placement above and below the base plane. New patterned microstructured films, and methods of making them, are desirable.

SUMMARY

In one aspect, the present disclosure describes a three-dimensional polymeric article having first and second opposed major surfaces, a first dimension perpendicular to a second dimension, a thickness orthogonal to the first and second dimensions, and a plurality of alternating first and second polymeric regions along the first or second dimensions, wherein the first and second regions extend at least partially across the second dimension, wherein the first regions are in a common plane and wherein some of the second regions project outwardly from the plane in a first direction (generally perpendicular from the plane), and some of the second regions project outwardly from the plane in a second direction that is generally 180 degrees from the first direction, where the first regions have a first crosslink density, wherein the second regions have a second crosslink density, and wherein the second crosslink density of the second regions are less (in some embodiments, at least 1% less, 2% less, 3% less, 4% less, 5% less, 10% less, 15% less, 20% less, 25% less, 30% less, 35% less, 40% less, 45% less, 50% less, 55% less, 60% less, 65% less, 70% less, 75% less, 80% less, 85% less, 90% less, 95% less, or even 100 less) than the first crosslink density of the first regions.

In another aspect, the present disclosure describes a method of making the three-dimensional polymeric article described herein, the method comprising:

providing an oriented crosslinkable film having first and second opposed major surfaces;

irradiating (e.g., with e-beam, ultraviolet (UV), x-ray, and/or gamma radiation) through at least a portion of the first major surface of the oriented, crosslinkable film to cause at least some portions under the first major surface to be irradiated and at least partially crosslink to provide first irradiated portions, wherein there remain after said irradiating at least second portions that are less irradiated than (which include zero irradiation) the first irradiated portions and, wherein the first irradiated portions have a lower shrink ratio than the second irradiated portions; and dimensionally relaxing (e.g., via heating and/or via removing tension) the irradiated film.

"Crosslink density" as used herein refers to the quotient of the non-irradiated, polymer film density divided by the average molecular mass between crosslinks, $M_c$, as calculated using the Flory-Rehner equation (Equation 1).

$$\frac{1}{M_c} = \frac{2}{M_n} - \frac{\frac{v_s}{V_1}(\ln(1-v_2) + v_2 + \chi_1 v_2^2)}{v_2^{1/3} - \frac{v_2}{2}}. \quad \text{Equation 1}$$

wherein,
$M_c$=average molecular mass between crosslinks,
$M_n$=number-average molecular mass of the un-crosslinked polymer,
$V_1$=molar volume of the solvent,
$v_2$=polymer volume fraction in the equilibrium swollen gel,
$v_s$=specific volume of the polymer, and
$\chi_1$=polymer-solvent interaction parameter.

"Shrink ratio" as used herein refers to the length or width of a piece of film before dimensionally relaxing divided by the respective length or width of the same piece of film after dimensionally relaxing, wherein the film is dimensionally relaxable in the length or width dimension.

"Dimensionally relaxable" as used herein refers to the property wherein at least one dimension of a material undergoes a reduction in size during the dimensional relaxation process. Dimensional relaxation processes include heating of a heat shrinkable film or releasing tension on a stretched film. The shrink ratio of a film in the length dimension may or may not be equivalent to the shrink ratio of a film in the width dimension. One way to change the shrink ratio of a film is to change the degree of crosslinking or crosslink density of the film. Irradiating oriented, crosslinkable films with suitable radiation can increase the crosslink density of a film, and subsequently decrease the shrink ratio of the irradiated portions of the film. Suitable radiation includes electron beam, UV, x-ray, and/or gamma radiation.

Embodiments of the three-dimensional polymeric article described herein are useful, for example, in providing a dual-sided, textured wrapping film such that greater grip is realized both on an item wrapped by the film and the wrapped item itself.

DETAILED DESCRIPTION

Figure 1:
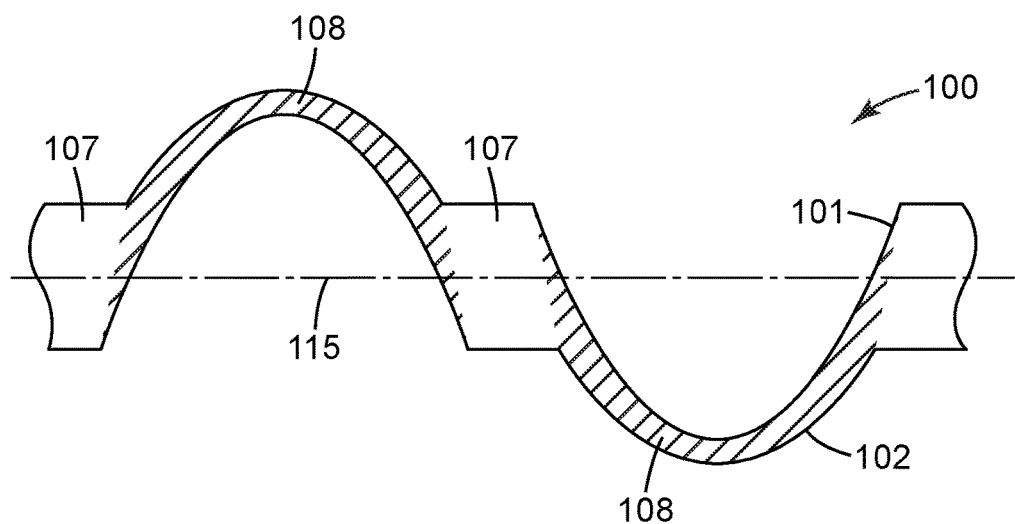
FIG. 1 is a side view schematic of an exemplary three-dimensional polymeric article described herein.

Referring to FIG. 1, exemplary three-dimensional polymeric article 100 has first and second opposed major surfaces 101, 102, a length, a width, and a plurality of alternating first and second polymeric regions 107, 108 along the length (and/or width; length as shown). The widths of the first and second regions 107, 108 extend at least partially across the width. First regions 107 are in common plane 115. Second regions 108 project outwardly from plane 115. Some second regions 107 project outwardly from plane 108 in one direction, and some second regions 107 project outwardly from plane 108 in a second direction that is generally 180 degrees from the first direction. First regions 107 have a first crosslink density. Second regions 108 have a second crosslink density. First crosslink density of the first regions 107 is more than the second crosslink density of second regions 108.

Three-dimensional polymeric articles described herein can be made, for example, by:

providing an oriented crosslinkable film having first and second opposed major surfaces, irradiating (e.g., with e-beam, UV, x-ray, and/or gamma radiation) through at least a portion of the first major surface of the oriented, crosslinkable film to cause at least some portions under the first major surface to be irradiated and at least partially crosslink to provide first irradiated portions, wherein there remain after said irradiating at least second portions that are less irradiated than (which include zero irradiation) the first irradiated portions and, wherein the first irradiated portions have a lower shrink ratio than the second irradiated portions; and dimensionally relaxing (e.g., via heating, via removing tension, etc.) the irradiated film. It is understood that when irradiating through a major surface of the film the surface too is irradiated. In some embodiments of the method, portions of the first major surface are masked to at least reduce exposure of the radiation through the first major surface.

Techniques for masking are known in the art and include the use of aperture masks as well as photomasking as used in lithographic processes. In some embodiments, maskless radiation techniques including electron beam lithography, x-ray lithography, interference lithography, direct-write digital imaging lithography, and multiphoton lithography can be used to selectively irradiate through the first major surface.

In general, suitable oriented, crosslinkable films possess the ability to crosslink polymer chains in the film upon irradiation (e.g., by electron beam, x-ray, UV, and/or gamma radiation) and the property of being dimensionally relaxable, where dimensionally relaxable refers to the property wherein at least one dimension of a material undergoes a reduction in size during the relaxation process. For example, elastomeric materials in a stretched state are dimensionally relaxable, wherein the relaxation process is the release of stretch or strain in the elastic material. In the case of heat shrink materials, thermal energy is supplied to the material to allow release of the orientation-induced strain in the heat shrink material. Examples of heat shrinkable materials include polyolefins, polyurethanes, polystyrenes, polyvinylchloride, poly(ethylene-vinyl acetate), fluoropolymers (e.g., polytetrafluoroethylene (PTFE), synthetic fluoroelastomer (available, for example, under the trade designation "VITON" from DuPont, Wilmington, Del.), polyvinylidenefluoride (PVDF), fluorinated ethylene propylene (FEP)), silicone rubbers, and polyacrylates. Examples of other useful polymeric substrate materials are shape memory polymers such as polyethylene terephthalate (PET), polyethyleneoxide (PEO), poly(1,4-butadien), polytetrahydrofuran, poly(2-methyl-2-oxazoline), polynorbornene, block-copolymers, and combinations thereof). Examples of elastomeric materials include natural and synthetic rubbers, fluoroelastomers, silicone elastomers, polyurethanes, and polyacrylates. Suitable oriented, crosslinkable films may be obtained from heat shrink film suppliers, including Sealed Air, Elwood Park, N J, and Clysar, Clinton, Iowa.

Ultraviolet, or "UV," activated cross-linkers can also be used to crosslink the film to modulate dimensional relaxation. Such UV cross-linkers may include non-copolymerizable photocrosslinkers, such as benzophenones and copolymerizable photocrosslinkers such as acrylated or methacrylated benzophenones like 4-acryloxybenzophenones. Additionally, the use of multifunctional, free radical polymerizable molecules in combination with a photo-induced free radical generator (photoinitiator) may be used to form crosslinked networks under UV irradiation. Examples of multifunctional, free radical polymerizable molecules would be multifunctional acrylates such as hexanediol diacrylate or trimethylolpropane triacrylate, both available from Sartomer, Exton, Pa. Exemplary photoinitiators are available under the trade designations "IRGACURE 651" and "DAROCUR 1173," available from BASF, Tarrytown, N.Y.

In some embodiments, the oriented, crosslinkable films have a thickness prior to dimensional relaxation in a range from 1 micrometer to 1000 micrometers (in some embodiments, in a range from 5 micrometers to 500 micrometers, 10 micrometers to 250 micrometers, or even 10 micrometers to 100 micrometers).

In some embodiments, the oriented, crosslinkable films comprise a filler material (e.g., an inorganic material). Exemplary fillers include beads, bubbles, rods, fibers or generally particles comprising glass (e.g., soda lime, borosilicate, etc.), ceramic (e.g., oxides of silicon, aluminum, titanium, zirconium, or combinations thereof), metal (e.g., silver, gold, copper, aluminum, zinc) or combination thereof, and/or glass-ceramics.

The polymeric substrate having the irradiated portions thereon can be dimensionally relaxed, for example, via heating and/or removing tension. For example, pre-stretched elastomeric substrates can be relaxed by releasing the tension holding the substrate in the stretched state. In the case of heat shrinkable substrates, the substrates may be placed, for example, in a heated oven or heated fluid until the desired reduction in dimension is achieved.

In some embodiments, the irradiated substrate has an original length (or width) and is dimensionally relaxed in length (or width) by at least 20 (in some embodiments, at least 25, 30, 40, 50, 60, 70, or even at least 80) percent of the original length (or width). Higher percent changes of original length upon dimensional relaxation typically produce greater extensions in the substrate after relaxation.

Typically, in the range from 40 to 60 percent by number of the second regions project outwardly from the common plane in the first direction and in the range of 60 to 40 percent by number of the second regions project outwardly from the common plane in the second direction.

In some embodiments, in the range from 0.5% to 99.5% of the first major surface comprises the first regions.

In some embodiments, the first and second regions each have an average thickness, and wherein the average thickness of the second regions is at least 1 micrometer (in some embodiments, at least 5, 10, 15, 20, 25, 30, 35, 40, 45, 50, 55, 60, 65, 70, 75, 80, 85, 90, 95, or even at least 100 micrometers) greater than the average thickness of the first regions. The thickness in a given (first or second) region of the three-dimensional polymeric article is the shortest distance between a point on the first major surface to the second major surface of the three-dimensional polymeric article within the given region.

Embodiments of the three-dimensional polymeric article described herein are useful for providing a dual-sided, textured wrapping film such that greater grip is realized both on an item wrapped by the film and the wrapped item itself.

Exemplary Embodiments

1A. A three-dimensional polymeric article having first and second opposed major surfaces, a first dimension perpendicular to a second dimension, a thickness orthogonal to the first and second dimensions, and a plurality of alternating first and second polymeric regions along the first or second dimensions, wherein the first and second regions extend at least partially across the second dimension, wherein the first regions are in a common plane and wherein some of the second regions project outwardly from the plane in a first direction (generally perpendicular from the plane), and some of the second regions project outwardly from the plane in a second direction that is generally 180 degrees from the first direction, where the first regions have a first crosslink density, wherein the second regions have a second crosslink density, and wherein the second crosslink density of the second regions are less (in some embodiments, at least 1% less, 2% less, 3% less, 4% less, 5% less, 10% less, 15% less, 20% less, 25% less, 30% less, 35% less, 40% less, 45% less, 50% less, 55% less, 60% less, 65% less, 70% less, 75% less, 80% less, 85% less, 90% less, 95% less, or even 100% less) than the first crosslink density of the first regions.

2A. The three-dimensional polymeric article of Exemplary Embodiment 1A having in the range from 0.5% to 99.5% of the first major surface comprising the first regions.

3A. The three-dimensional polymeric article of any preceding A Exemplary Embodiment, wherein the first and second regions comprise a filler material (e.g., inorganic material).

4A. The three-dimensional polymeric article of any preceding A Exemplary Embodiment, the first and second regions each have an average thickness, and wherein the average thickness of the second regions is at least 1 micrometer (in some embodiments, at least 5, 10, 15, 20, 25, 30, 35, 40, 45, 50, 55, 60, 65, 70, 75, 80, 85, 90, 95, or even at least 100 micrometers) greater than the average thickness of the first regions (wherein the thickness in a given (first or second) region of the three-dimensional polymeric article is the shortest distance between a point on the first major surface to the second major surface of the three-dimensional polymeric article within the given region).

1B. A method of making the three-dimensional polymeric article of any preceding A Exemplary Embodiment, the method comprising:

providing an oriented crosslinkable film having first and second opposed major surfaces;

irradiating (e.g., with e-beam, UV, x-ray, and/or gamma radiation) through at least a portion of the first major surface of the oriented, crosslinkable film to cause at least some portions under the first major surface to be irradiated and at least partially crosslink to provide first irradiated portions, wherein there remain after said irradiating at least second portions that are less irradiated than (which include zero irradiation) the first irradiated portions and, wherein the first irradiated portions have a lower shrink ratio than the second irradiated portions; and dimensionally relaxing (e.g., via heating and/or via removing tension) the irradiated film.

2B. The method of Exemplary Embodiment 1B, wherein portions of the first major surface are masked to at least reduce exposure of the radiation through at least portions of the first major surface.

Advantages and embodiments of this invention are further illustrated by the following examples, but the particular materials and amounts thereof recited in these examples, as well as other conditions and details, should not be construed to unduly limit this invention. All parts and percentages are by weight unless otherwise indicated.

EXAMPLES

Materials

| Designation | Description |
| --- | --- |
| PO Heat Shrink Film (25 micrometers) | Polyolefin (PO) heat shrink film, 25 micrometers, shrink ratio ~4.4:1, (obtained from Sealed Air, Elmwood Park, NJ, under trade designation "CRYOVAC D-955") was laminated to a 3 mil (75 micrometer) polyethylene terephthalate (PET) film with a thin film of latex emulsion pressure sensitive adhesive (PSA) to form a multilayer film that is easier to handle. The PO heat shrink film layer was peeled away from the PSA/PET film prior to heating. |

-continued

| Designation | Description |
| --- | --- |
| PO Heat Shrink Film (19 micrometers) | Polyolefin (PO) heat shrink film, 19 micrometers, shrink ratio ~4.4:1, (obtained from Sealed Air, Elmwood Park, NJ, under trade designation "CRYOVAC D-955"). |
| Circular Hole Array Mask-I | Perforated aluminum plate, 1/16" (1.59 mm) thick, with hexagonal array of circular holes 3/32" (2.38 mm) diameter holes (obtained from Amazon.com under trade designation "ASID: B004OR1A7C"). |
| Circular Hole Array Mask-II | Perforated aluminum plate, 1/16" (1.59 mm) thick, with hexagonal array of circular holes 3/16" (4.76 mm) diameter holes (obtained from Amazon.com under trade designation "ASID: B004OR1A7C"). |

Methods

Method for Electron Beam Irradiation of Film Substrates

All electron beam (e-beam) irradiation was performed using an electron beam source (obtained under trade designation "ELECTROCURTAIN" from Energy Sciences, Inc. (ESI), Wilmington, Del.) running at 300 kV. The PO heat shrink film samples were taped with a polyester tape (obtained from 3M Company under trade designation "3M POLYESTER TAPE 8403") onto a carrier web of PET film running at 18.9 ft./min. (5.76 m/min.) into the e-beam chamber. E-beam dose was controlled to deliver 2.5-40 Mrad in a single pass through the e-beam or cumulatively in multiple passes.

Method for Dimensionally Relaxing Substrates

Small pieces about 5 cm×5 cm (~2 inches×~2 inches) in size of the irradiated PO heat shrink film were cut with a pair of scissors and heated to convert to their "relaxed states". More specifically, the heat shrink films were placed between two polytetrafluoroethylene (PTFE) mesh screens and placed in a preheated oven at 145° C. (air temperature) for about 45 to 120 seconds before rapidly removing and cooling to about 40° C. within 1 minute.

Method for Optical Microscopy

Optical images were obtained using a microscope (obtained under the trade designation "ZEISS STEMI 2000-C" from Allied High Tech Products, Inc., Rancho Dominguez, Calif.) with a digitizer (obtained under the trade designation "AXIOCAM ICC3" from Allied High Tech Products, Inc., Rancho Dominguez, Calif.) for digital image capture via a computer.

Method for Scanning Electron Microscopy

Images were obtained using a Scanning Electron Microscope (SEM) (obtained from JEOL Inc., Tokyo, Japan, under the trade designation "JEOL BENCH TOP SEM"). A 45° angle mount (obtained from Ted Pella, Inc., Redding, Calif., under trade designation "PELCO SEM CLIP 45/90° MOUNT" (#16357-20)) was used for mounting samples in the SEM. A small piece of conductive carbon tape (obtained from 3M Company, St. Paul, Minn., under trade designation "3M TYPE 9712 XYZ AXIS ELECTRICALLY CONDUCTIVE DOUBLE SIDED TAPE") was placed at the top of the 45° angle surface of the mount, and samples were mounted by affixing a small piece of the film/tube onto the carbon tape. If possible, the sample piece was situated as close to the top edge of the 45° angle surface as possible. A small amount of silver paint (obtained from Ted Pella, Inc., Redding, Calif., under trade designation "PELCO CONDUCTIVE LIQUID SILVER PAINT" (#16034)) was then applied to a small region of each sample piece, and extended to contact either the carbon tape, aluminum mount surface or both. After briefly allowing the paint to air dry at room temperature, the mounted sample assembly was placed into a sputter/etch unit (obtained from Denton Vacuum, Inc., Moorestown, N.J., under the trade designation "DENTON VACUUM DESK V") and the chamber evacuated to ~0.04 Torr (5.33 Pa). Argon gas was then introduced into the sputtering chamber until the pressure stabilized at ~0.06 Torr (8.00 Pa) before initiating the plasma and sputter coating gold onto the assembly for 90-120 seconds at ~30 mA.

Cross-section images through the thickness of the films were obtained by orienting the sample 90 degrees relative to the beam. Thickness measurements were obtained from the image using the length measuring feature in the software (obtained under the trade designation "JCM-5000," version 1.2.3 from JEOL Inc.). Thickness in a given (first or second) region of the film was measured as the shortest distance between a point on the first major surface to the second major surface of the film. For each region thickness, three separate locations within the region were measured and averaged.

Method for Measuring Swell Ratio, Q

Swell Ratio was measured using ASTM D2765-01 (2006) (Test Method C), the disclosure of which is incorporated herein by reference. Samples of e-beam irradiated PO heat shrink film (19 micrometers) were immersed in 110° C. xylenes for 20 hours. Samples were weighed after the immersion period while wet and swollen, and again after drying.

Method for Calculating Cross-Link Density

Cross-link density was calculated by dividing the density of the polymer film by the average molecular mass between crosslinks, $M_c$. The average molecular mass between cross-links, $M_c$, was calculated using the Flory-Rehner equation (Equation 1).

$$\frac{1}{M_c} = \frac{2}{M_n} - \frac{\frac{v_s}{V_1}(\ln(1-v_2) + v_2 + \chi_1 v_2^2)}{v_2^{1/3} - \frac{v_2}{2}}. \quad \text{Equation 1}$$

wherein,
$M_c$=average molecular mass between crosslinks,
$M_n$=number-average molecular mass of the un-crosslinked polymer,
$V_1$=molar volume of the solvent,
$v_2$=polymer volume fraction in the equilibrium swollen gel,
$v_s$=specific volume of the polymer, and
$\chi_1$=polymer-solvent interaction parameter.

The polymer volume fraction in the equilibrium swollen gel, is the reciprocal of the swell ratio, Q. Under the conditions described in the section Method for Measuring Swell Ratio, Q, the molar volume of the solvent (xylenes), $V_1$, is 135.89 cm$^3$/mole at 110° C., as calculated from the reciprocal of the density of xylenes at 110° C. The specific volume of the polymer, $v_s$, is the reciprocal of the density of the polymer. The density of PO heat shrink film is 0.7 g/cm³ (as reported in U.S. Pat. No. 6,340,532 B1 (Bormann et al.), Comparative Example 3, Table 4), and therefore $v_s$ is 1.084 cm³/g. The polymer-solvent interaction parameter, $\chi_1$, used for low density polyethylene and xylenes at 120-140° C. is 0.28 and was obtained from *Physical Properties of Polymers Handbook*, AIP Press, New York, 1996, Chapter 14, Table 14.1. For the calculations herein, an estimated value of 27,300 g/mol was used.

Method for Calculation of Critical Unit Compressive Stress

Upon dimensional relaxation, the masked (less irradiated) regions of the polymeric article have a higher shrink ratio and compress the unmasked (more irradiated) regions having a lower shrink ratio. The critical unit compressive stress, σ' (i.e., buckling instability limit), is the stress limit above which an object will buckle and/or distort. The unmasked (exposed to e-beam radiation) regions in the Examples and Illustrative Examples are circular in form with a thickness (i.e., a circular plate). Equation 2 (below) was used to estimate the critical unit compressive stress, σ' (i.e., buckling instability limit) of a circular plate being acted upon by a uniform radial edge compression as described in Young, W. C., Budynas, R. G., 2001, *Roark's Formulas for Stress and Strain*, 7th Ed., New York, McGraw-Hill Professional, p. 734, Table 15.2.

$$\sigma' = K \cdot \frac{E}{1-v^2} \cdot \left(\frac{t}{a}\right)^2. \quad \text{Equation 2}$$

| $v$ | 0 | 0.1 | 0.2 | 0.3 | 0.4 |
|---|---|---|---|---|---|
| $K$ | 0.282 | 0.306 | 0.328 | 0.350 | 0.370 | wherein,
K=Column effective length factor,
E=Modulus of elasticity,
v=Poisson's ratio,
a=Radius of circular plate, and
t=Thickness of circular plate.

A Poisson's ratio (v) of 0.46 (and therefore, K~0.370) was used (based on data for polyethylene as reported in [http://www.goodfellow.com/E/Polyethylene-High-density.html]) for PO heat shrink film (obtained under the trade designation "CRYOVAC D-955" from Sealed Air, Elmwood Park, N.J.).

The elastic modulus (E), for the heat shrink film ("CRYOVAC D-955") was between 60,000 psi and 65,000 psi (413 MPa and 448 MPa, respectively) for the longitudinal and transverse film directions, respectively, as reported in the Technical Data Sheet for the "CRYOVAC D-955" PO heat shrink film.

The radius (a) and thickness (t) of the resulting exposed circular hole region was calculated assuming that no buckling in the hole (unmasked) region occurred after shrinking of the masked, irradiated PO heat shrink film by using the shrink ratio of the film in the hole (unmasked) regions. The shrink ratio of the hole (unmasked) regions was determined by measuring the length and width of an unmasked, irradiated film before and after irradiation and dimensional relaxation using a digital caliper (obtained under the trade designation "MODEL TRESNA EC16 SERIES, 111-101B," 0.01 mm resolution, ±0.03 accuracy, from Guilin Guanglu Measuring Instruments Co., Ltd., Guilin, China). Thickness measurements were taken as the distance between the highest and lowest points in the overall film. Since, electron beam radiation can reduce the shrink ratio of PO heat shrink film depending on the dose as a result of the extent of crosslinking, shrink ratios of the PO heat shrink film were determined after exposing (as described above under Method for Electron Beam Irradiation of Film Substrates) the film to various doses of electron beam radiation as reported in Table 1A, below. Samples in Table 1A were 25 micrometer thick polyolefin (PO) heat shrink films before shrinking and were placed in a preheated oven at 145° C. for 45 seconds. Calculated crosslink density values for PO heat shrink film irradiated at 0, 2.5, 5, 10, and 20 Mrad are summarized in Table 1B, below. Samples in Table 1B were 19 micrometer thick polyolefin (PO) heat shrink films before shrinking and were placed in a preheated oven at 145° C. for 120 seconds.

TABLE 1A

| Dose/pass (Mrads) | # of passes | Total Dose (Mrads) | Shrink Ratio (width) | Shrink Ratio (length) | Thickness after shrinking, mm |
|---|---|---|---|---|---|
| 0 | 0 | 0 | 5.07 | 4.55 | 0.57 |
| 5 | 1 | 5 | 3.47 | 3.30 | 0.30 |
| 10 | 1 | 10 | 2.78 | 2.87 | 0.18 |
| 20 | 1 | 20 | 2.13 | 2.03 | 0.10 |
| 20 | 2 | 40 | 1.66 | 1.71 | 0.06 |

TABLE 1B

| Total Dose, Mrads | Shrink Ratio, (width) | Shrink Ratio (length) | Thickness after shrinking, mm | Swell Ratio | Crosslink density, (×10⁻⁵) mol/cm³ |
|---|---|---|---|---|---|
| 0 | 4.77 | 5.17 | 0.45 | Undefined* | 0* |
| 2.5 | 3.58 | 4.21 | 0.30 | 422 | 6.76 |
| 5 | 3.29 | 3.40 | 0.21 | 75.1 | 6.88 |
| 10 | 2.53 | 2.72 | 0.14 | 21.3 | 7.89 |
| 20 | 2.24 | 2.39 | 0.11 | 12.5 | 9.76 |

*No gel remained after the immersion in hot xylenes, implying little to no (stable) crosslinking of the polymer is present in this sample under the test conditions.

Examples 1 and 2, Illustrative Examples A and B

Example 1 (EX1), Example 2 (EX2), Illustrative Example A (IE-A), and Illustrative Example B (IE-B) samples were prepared as described above in the Method for Electron Beam Irradiation of Film Substrates section. Table 2, below, summarizes the substrates, masks, and total dose for each sample in EX1, EX2, IE-A, and IE-B. Examples in Table 2 were 25 micrometer thick polyolefin (PO) heat shrink films before shrinking and were placed in a preheated oven at 145° C. for 45 seconds.

TABLE 2

| Example | Substrate | Mask | Dose/Pass, Mrad | Number of Passes | Total Dose, Mrad | First Region Thickness, micrometers | Second Region Thickness, micrometers |
|---|---|---|---|---|---|---|---|
| EX1 | PO heat shrink | Circular Hole | 20 | 2 | 40 | 233 | 320 |

TABLE 2-continued

| Example | Substrate | Mask | Dose/Pass, Mrad | Number of Passes | Total Dose, Mrad | First Region Thickness, micrometers | Second Region Thickness, micrometers |
|---|---|---|---|---|---|---|---|
| | film | Array Mask-I | | | | | |
| EX2 | PO heat shrink film | Circular Hole Array Mask-II | 20 | 1 | 20 | 137 | 313 |
| IE-A | PO heat shrink film | Circular Hole Array Mask-I | 20 | 1 | 20 | 113 | 307 |
| IE-B | PO heat shrink film | Circular Hole Array Mask-II | 10 | 1 | 10 | 250 | 390 |

Various optical images of EX1, EX2, IE-A, and IE-B are shown in FIGS. 2A-9B.

Figure 2A:
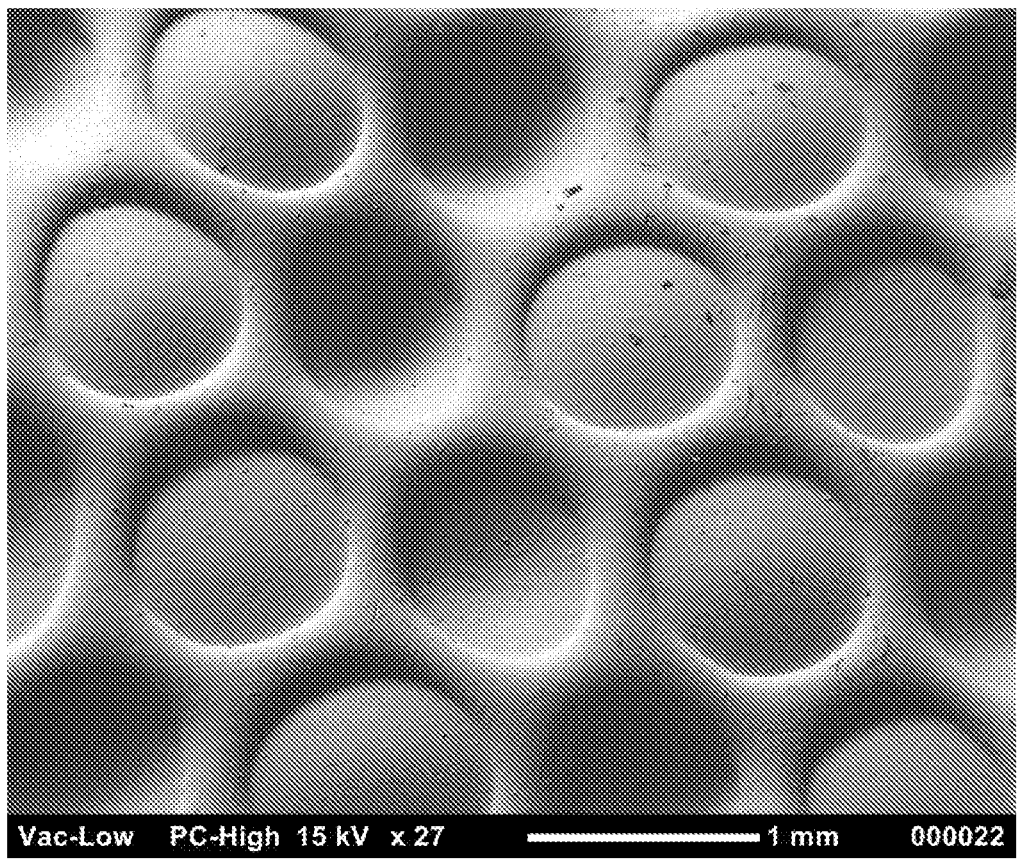
FIG. 2A is a top view scanning electron digital micrograph of Example 1.

FIG. 2A is a top view scanning electron digital micrograph of Example 1.

Figure 2B:
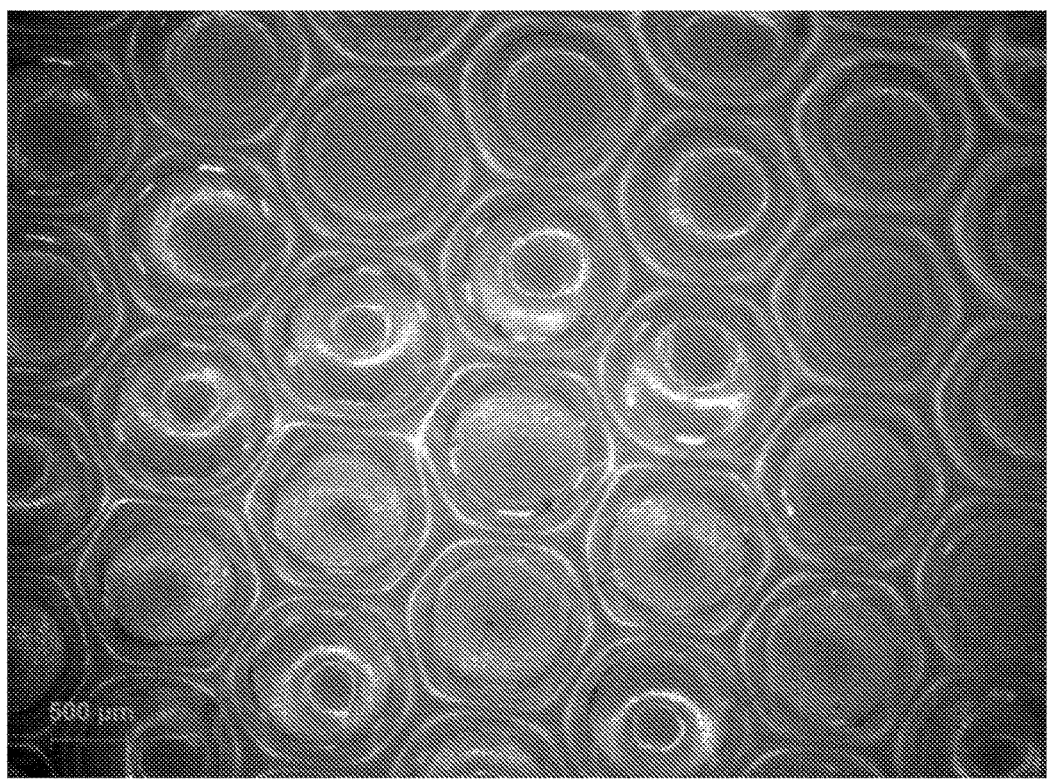
FIG. 2B is an optical image of the top view of Example 1.

FIG. 2B is an optical image of the top view of Example 1.

Figure 3A:
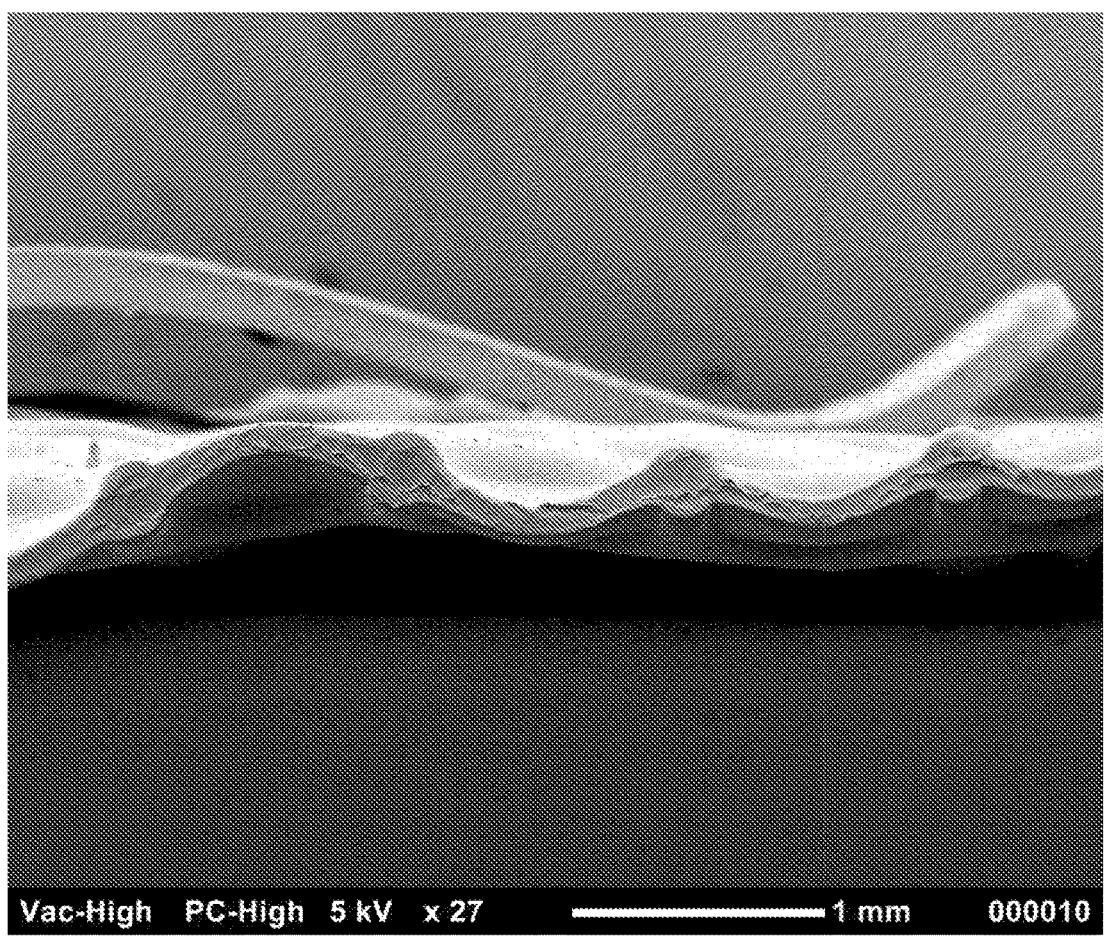
FIG. 3A is a cross-sectional view scanning electron digital micrograph of Example 1.

FIG. 3A is a cross-sectional view scanning electron digital micrograph of Example 1.

Figure 3B:
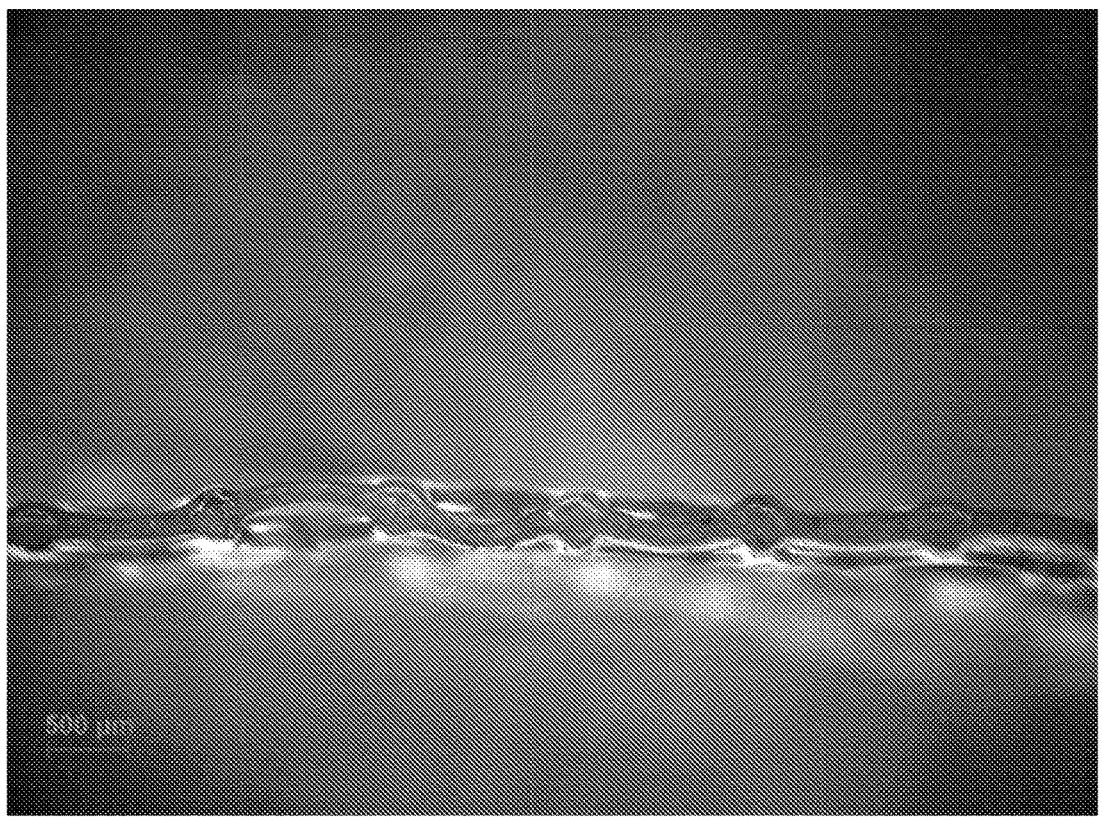
FIG. 3B is an optical image of the cross-sectional view of Example 1.

FIG. 3B is an optical image of the cross-sectional view of Example 1.

Figure 4A:
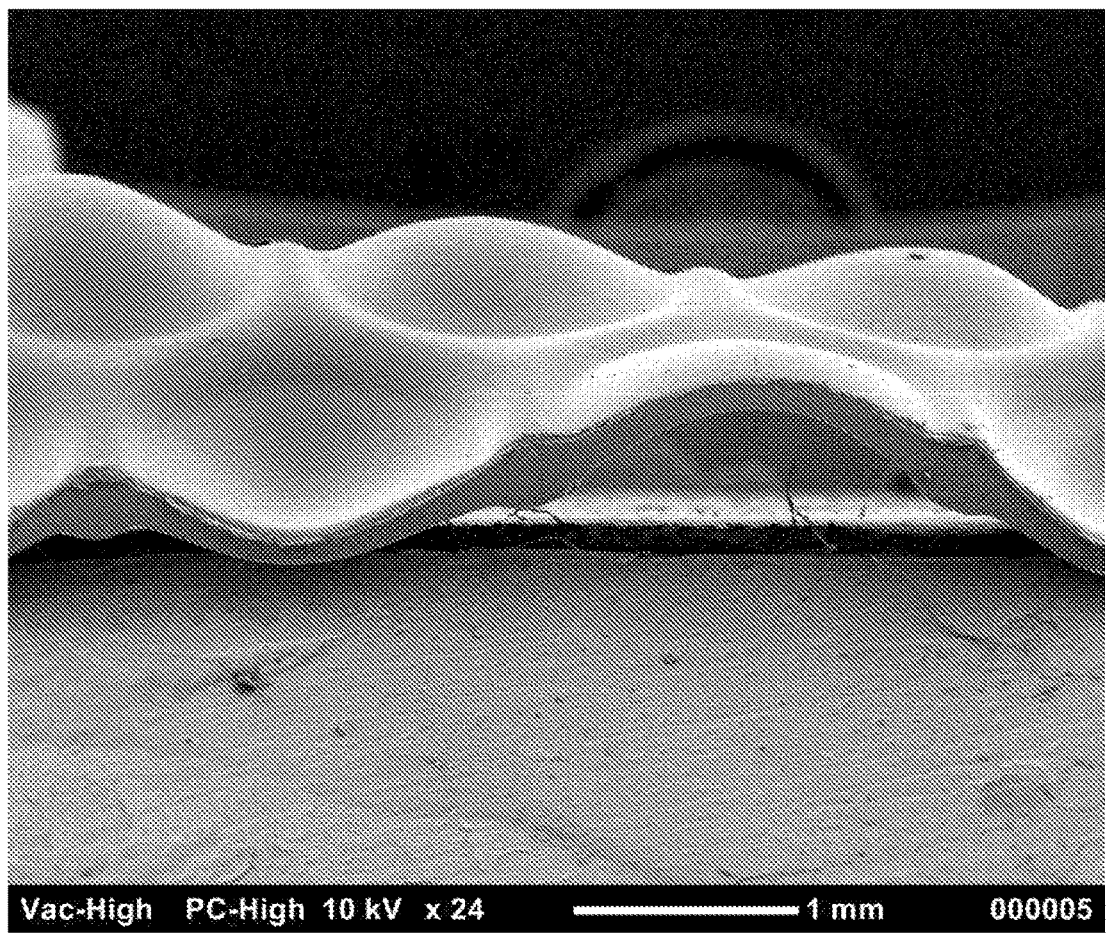
FIG. 4A is a perspective view scanning electron digital micrograph of Example 2.

FIG. 4A is a perspective view scanning electron digital micrograph of Example 2.

Figure 4B:
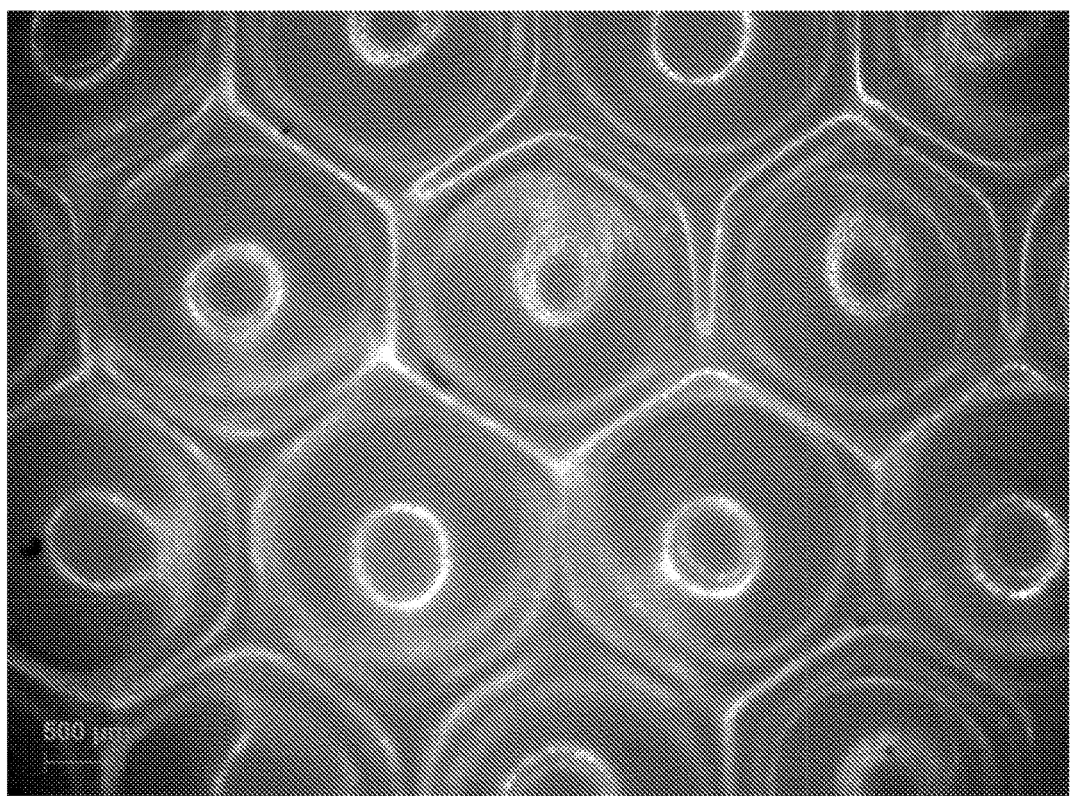
FIG. 4B is an optical image of the top view of Example 2.

FIG. 4B is an optical image of the top view of Example 2.

Figure 5A:
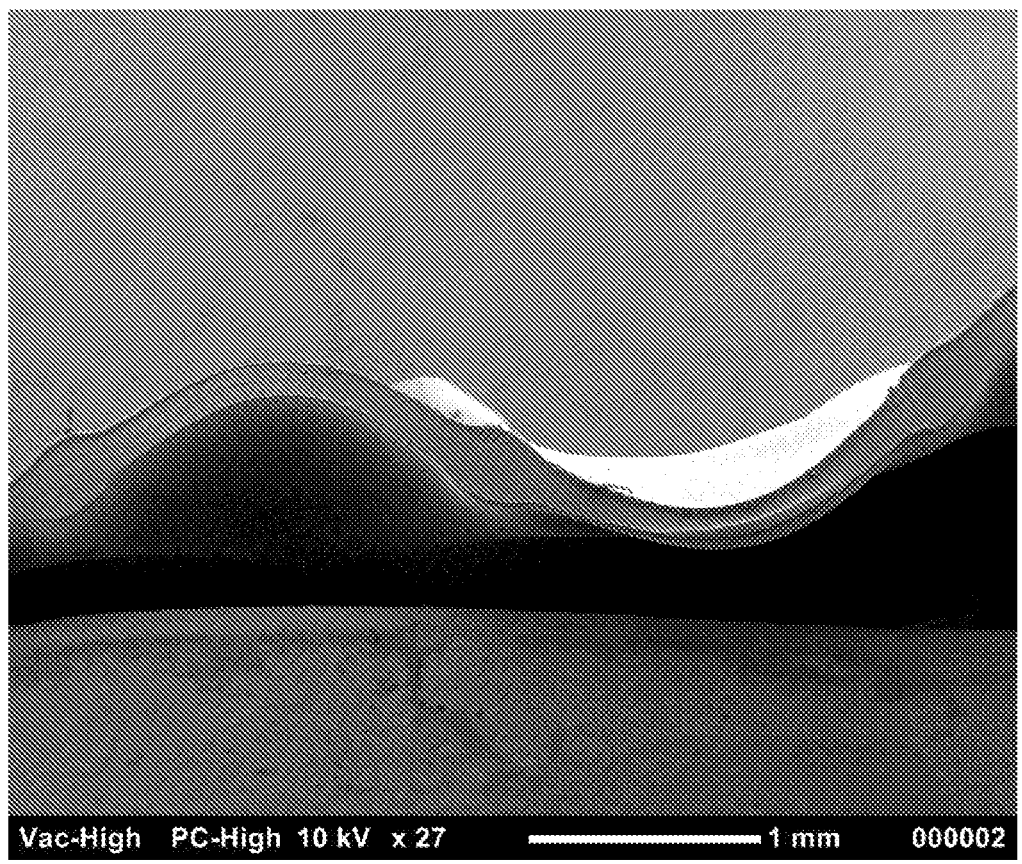
FIG. 5A is a cross-sectional view scanning electron digital micrograph of Example 2.

FIG. 5A is a cross-sectional view scanning electron digital micrograph of Example 2.

Figure 5B:
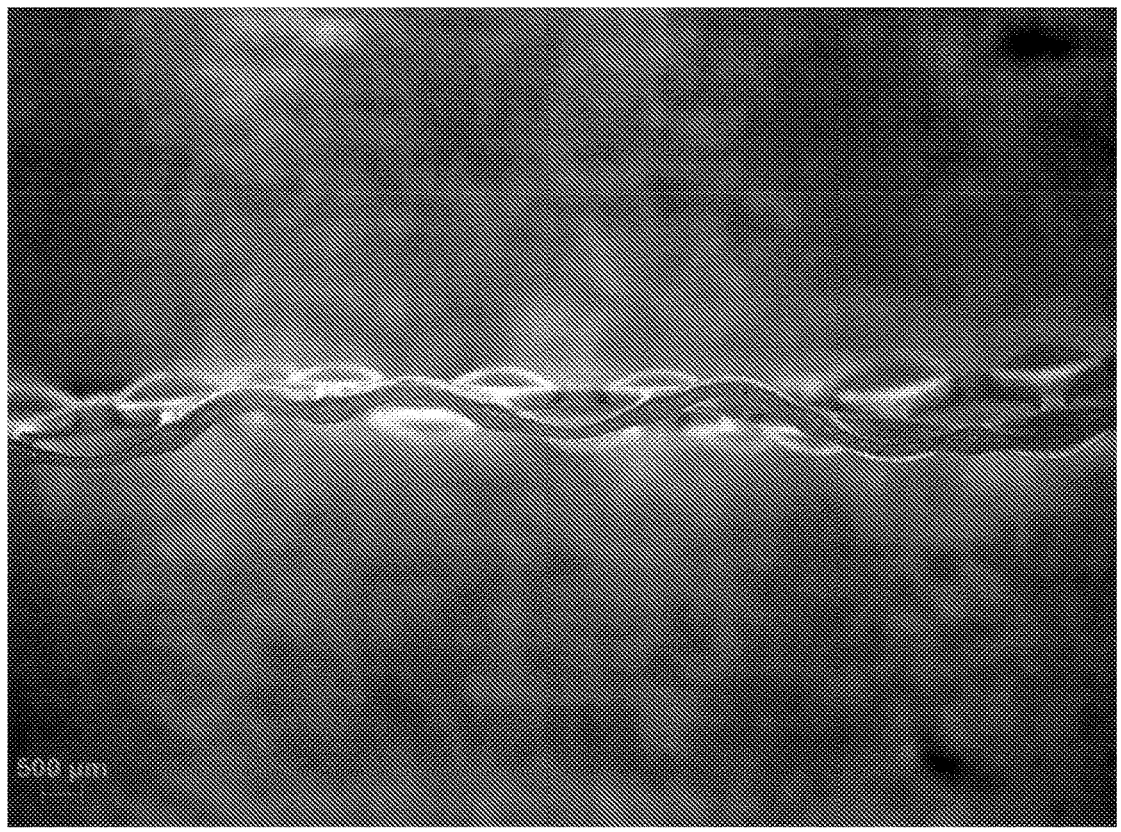
FIG. 5B is an optical image of the cross-sectional view of Example 2.

FIG. 5B is an optical image of the cross-sectional view of Example 2.

Figure 6A:
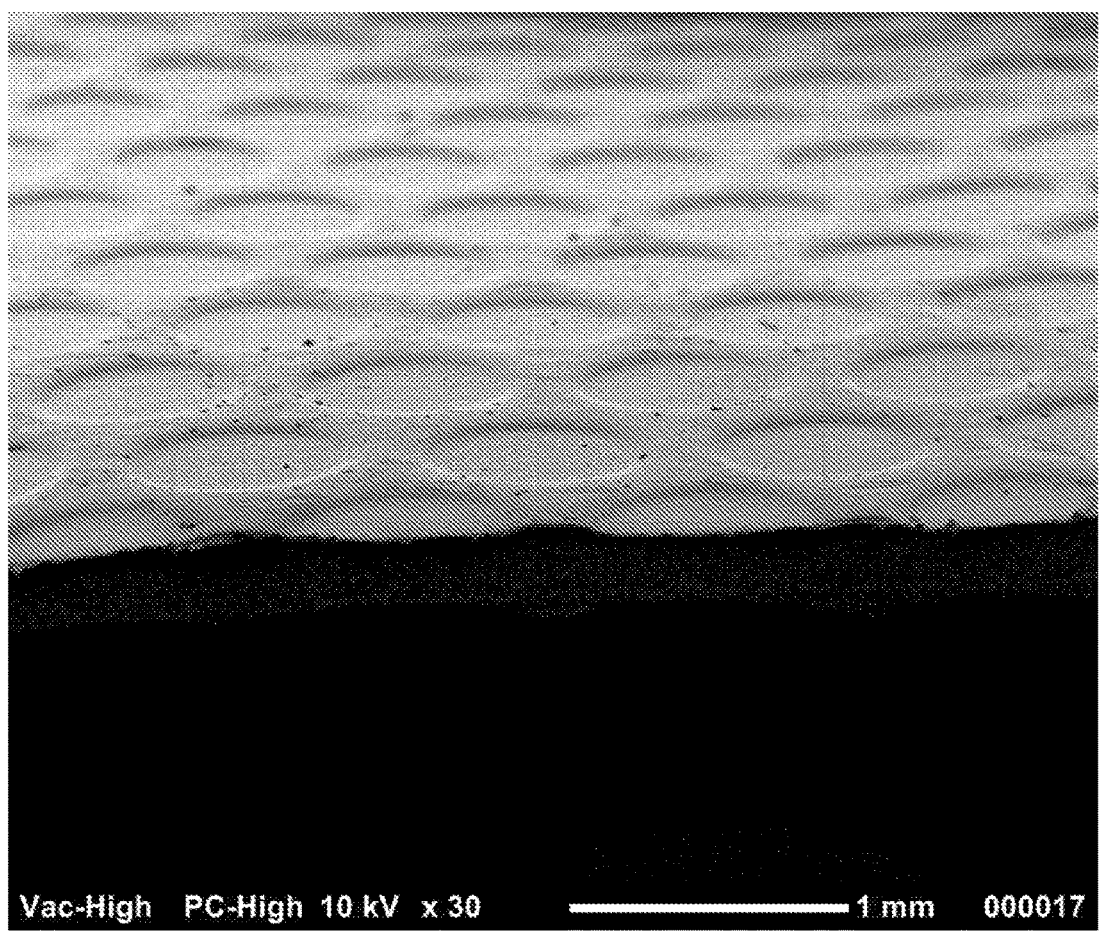
FIG. 6A is a perspective view scanning electron digital micrograph of Illustrative Example A.

FIG. 6A is a perspective view scanning electron digital micrograph of Illustrative Example A.

Figure 6B:
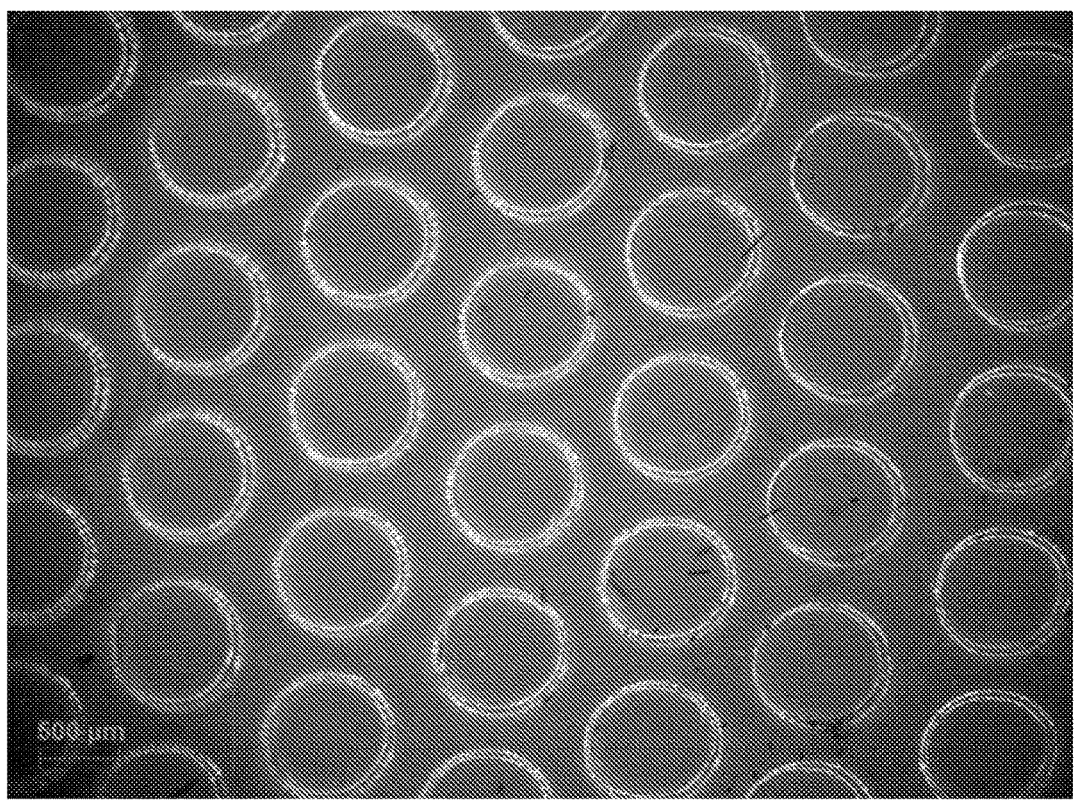
FIG. 6B is an optical image of the top view of Illustrative Example A.

FIG. 6B is an optical image of the top view of Illustrative Example A.

Figure 7A:
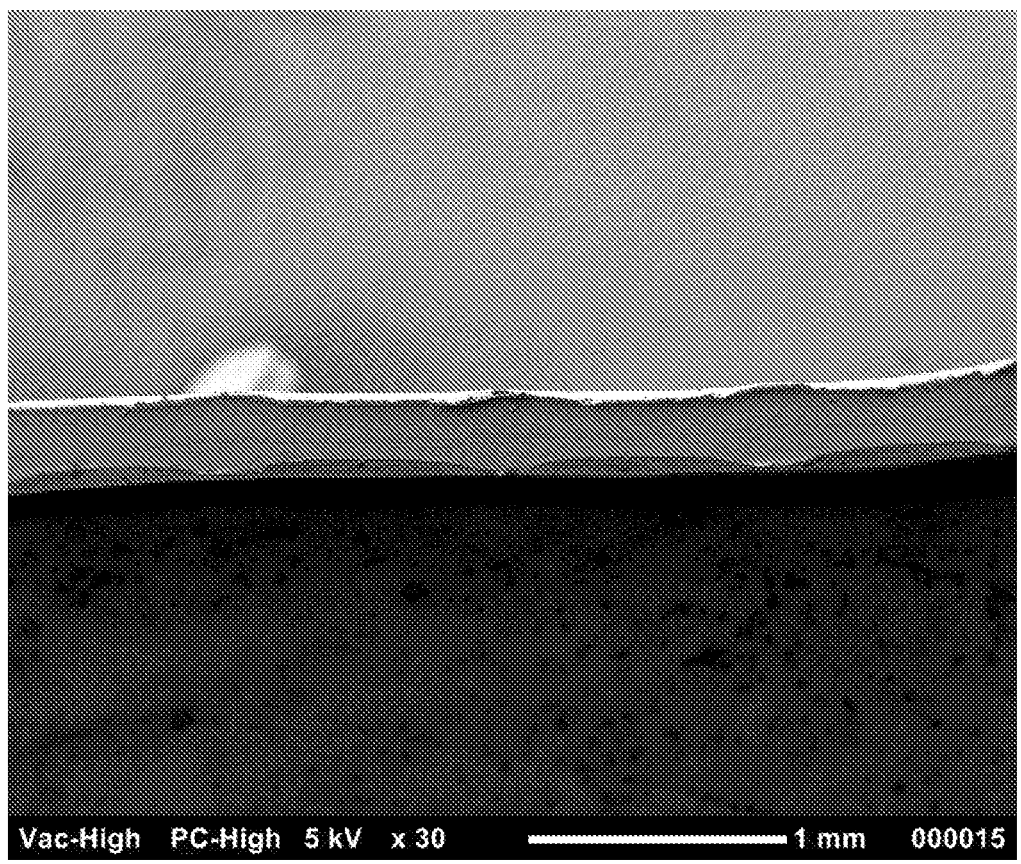
FIG. 7A is a cross-sectional view scanning electron digital micrograph of Illustrative Example A.

FIG. 7A is a cross-sectional view scanning electron digital micrograph of Illustrative Example A.

Figure 7B:
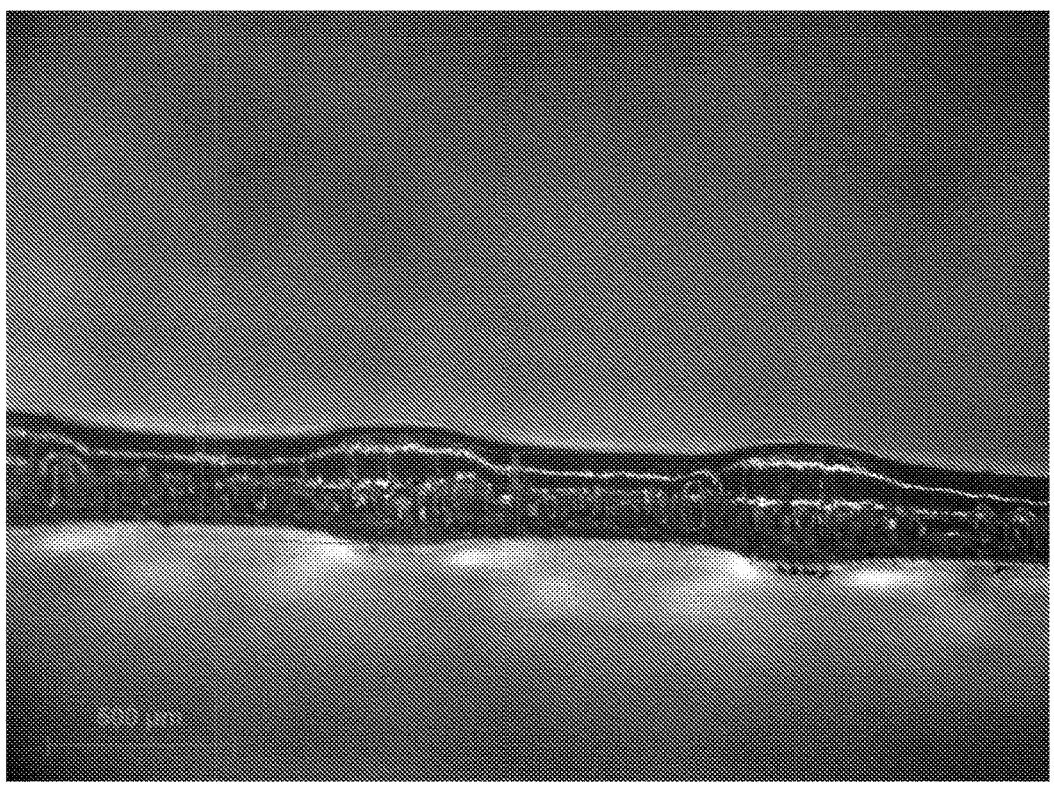
FIG. 7B is an optical image of the cross-sectional view of Illustrative Example A.

FIG. 7B is an optical image of the cross-sectional view of Illustrative Example A.

Figure 8A:
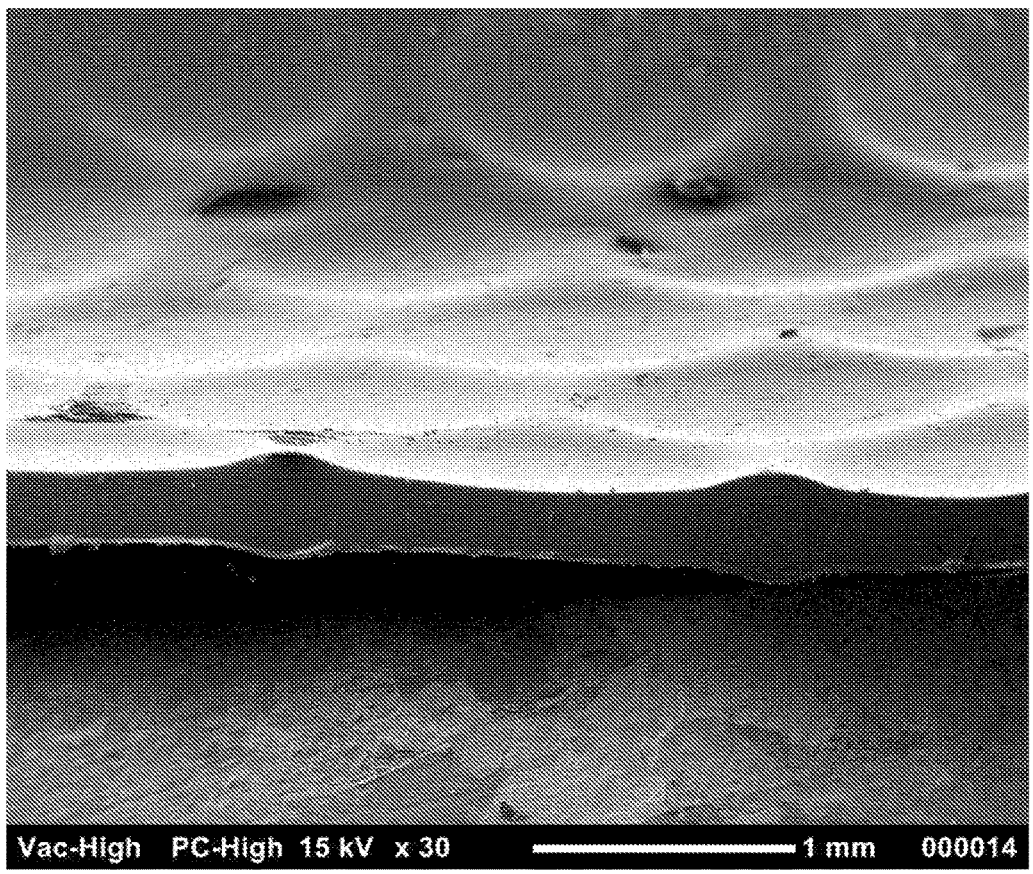
FIG. 8A is a perspective view scanning electron digital micrograph of Illustrative Example B.

FIG. 8A is a perspective view scanning electron digital micrograph of Illustrative Example B.

Figure 8B:
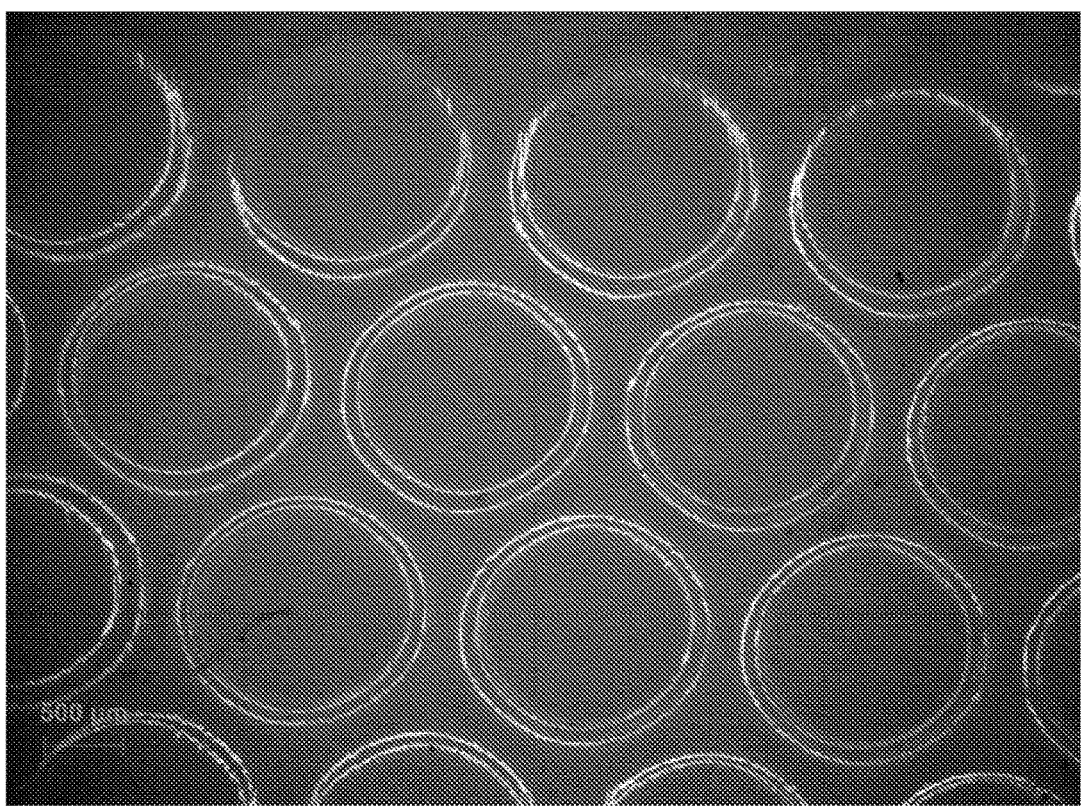
FIG. 8B is an optical image of the top view of Illustrative Example B.

FIG. 8B is an optical image of the top view of Illustrative Example B.

Figure 9A:
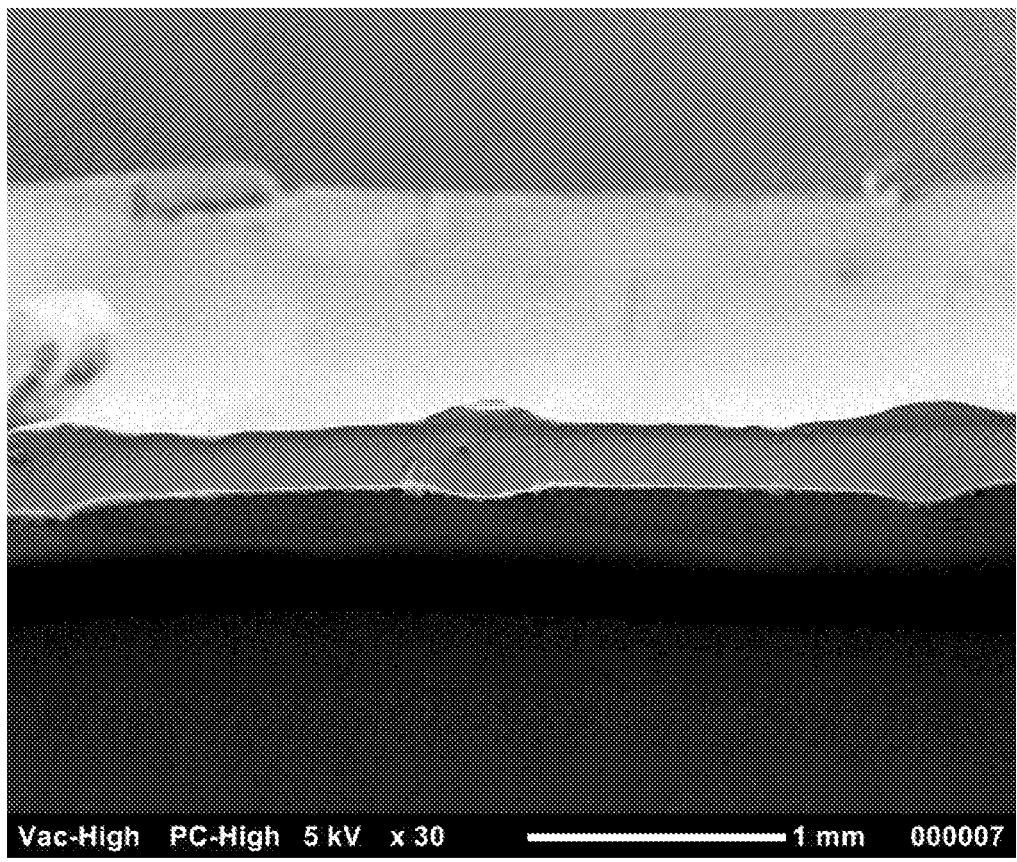
FIG. 9A is a cross-sectional view scanning electron digital micrograph of Illustrative Example B.

FIG. 9A is a cross-sectional view scanning electron digital micrograph of Illustrative Example B.

Figure 9B:
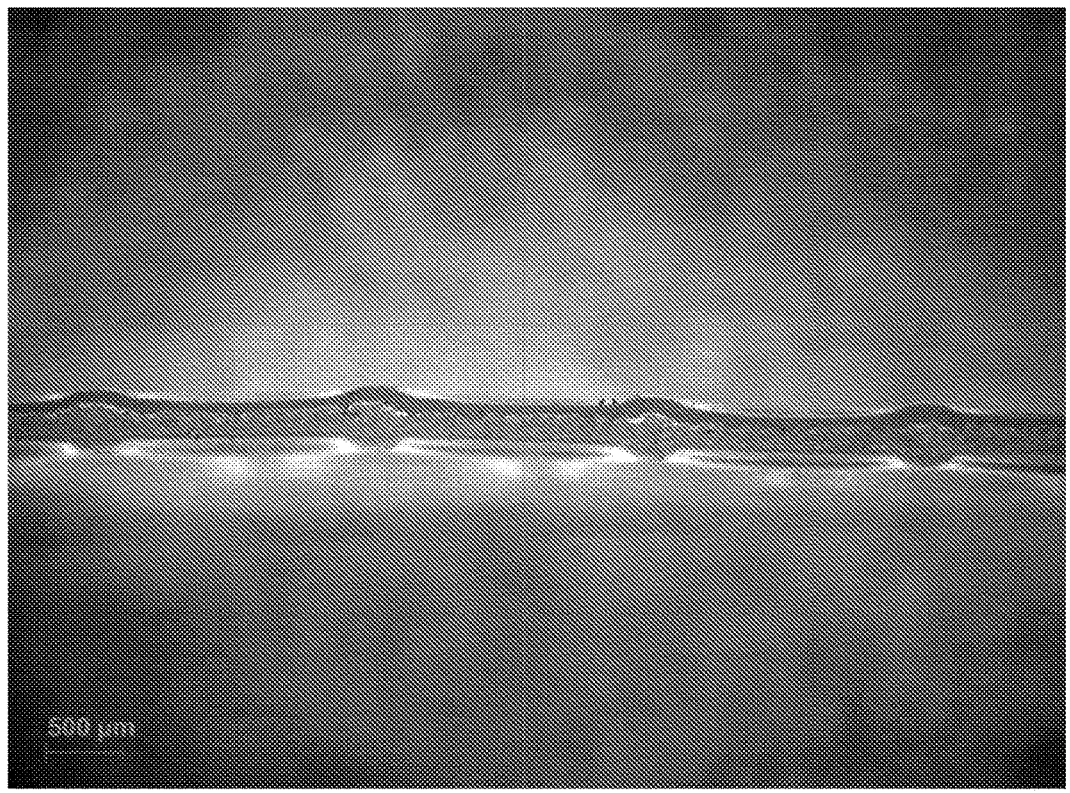
FIG. 9B is an optical image of the cross-sectional view of Illustrative Example B.

FIG. 9B is an optical image of the cross-sectional view of Illustrative Example B.

Table 3, below, summarizes the calculated expected values of radius (a), thickness (t), and critical unit compressive stress for the exposed circular hole regions in EX1, EX2, IE-A, and IE-B. The expected radius values (a) in Table 3 (below) were calculated by taking the product of hole radius and average shrink ratio values of width and length from Table 1, above. The expected thickness values (t) in Table 3 (below) were taken from the Table 1 based on the corresponding Total Dose. The masked (less irradiated) regions were assumed to have a Total Dose near 0 Mrad.

TABLE 3

| Example | Hole Radius, mm | Total Dose, Mrad | T, mm | A, mm | Critical Unit Compressive Stress, MPa |
|---|---|---|---|---|---|
| EX 1 | 1.190 | 40 | 0.06 | 0.56 | 2.33 |
| EX 2 | 2.381 | 20 | 0.1 | 1.12 | 1.62 |
| IE-A | 1.190 | 20 | 0.1 | 0.56 | 6.47 |
| IE-B | 2.381 | 10 | 0.18 | 1.12 | 5.24 |

Based on the data from the PO heat shrink film ("CRYOVAC D-955") Technical Data Sheet, the shrink tension for the PO heat shrink film ("CRYOVAC D-955") was ~600 psi (4.14 MPa). Although not wanting to be bound by theory, comparing the calculated critical unit compressive stress and PO heat shrink film tension values in Table 3, it appears there is a correlation as to whether exposed hole regions will buckle or remain planar during and after shrinking of the film. Although not wanting to be bound by theory, it appears that to obtain the structures of the Examples (e.g., as shown in FIGS. 1-5A), the critical unit compressive stress, a' (i.e., buckling instability limit), of any unmasked region should be less than the compressive stress of the surrounding shrinking film region.

Foreseeable modifications and alterations of this disclosure will be apparent to those skilled in the art without departing from the scope and spirit of this invention. This invention should not be restricted to the embodiments that are set forth in this application for comparative purposes.

What is claimed is:

1. A three-dimensional polymeric article having first and second opposed major surfaces, a first dimension perpendicular to a second dimension, a thickness orthogonal to the first and second dimensions, and a plurality of alternating first and second polymeric regions along the first or second dimensions, wherein the first and second regions extend at least partially across the second dimension, wherein the first regions are in a common plane and wherein some of the second regions project outwardly from the plane in a first direction, and some of the second regions project outwardly from the plane in a second direction that is generally 180 degrees from the first direction, where the first regions have a first crosslink density, wherein the second regions have a second crosslink density, and wherein the second crosslink density of the second regions are less than the first crosslink density of the first regions.

2. The three-dimensional polymeric article of claim 1, wherein the second crosslink density of the second regions are less than 1 percent the first crosslink density of the first regions.

3. The three-dimensional polymeric article of claim 1 having in the range from 0.5% to 99.5% of the first major surface comprising the first regions.

4. The three-dimensional polymeric article of claim 1, wherein the first and second regions comprise a filler material.

5. The three-dimensional polymeric article of claim 1, wherein the first and second regions each have an average thickness, and wherein the average thickness of the second regions is at least 1 micrometer greater than the average thickness of the first regions.

6. A method of making the three-dimensional polymeric article of claim 1, the method comprising:
   providing an oriented crosslinkable film having first and second opposed major surfaces,
   irradiating through at least a portion of the first major surface of the oriented, crosslinkable film to cause at least some portions under the first major surface to be irradiated and at least partially crosslink to provide first irradiated portions, wherein there remain after said irradiating at least second portions that are less irradiated than the first irradiated portions, and, wherein the first irradiated portions have a lower shrink ratio than the second irradiated portions; and
   dimensionally relaxing the irradiated film.

7. The method of claim 6, wherein portions of the first major surface are masked to at least reduce exposure of the radiation through at least portions of the first major surface.

8. The method of claim 6, wherein irradiating is conducted via at least one of e-beam, UV, x-ray, or gamma radiation.

* * * * *

UNITED STATES PATENT AND TRADEMARK OFFICE
CERTIFICATE OF CORRECTION

| | |
|---|---|
| PATENT NO. | : 10,434,686 B2 |
| APPLICATION NO. | : 16/061828 |
| DATED | : October 8, 2019 |
| INVENTOR(S) | : Evan Koon Lun Yuuji Hajime |

It is certified that error appears in the above-identified patent and that said Letters Patent is hereby corrected as shown below:

In the Specification

Column 1
Line 63, Delete "100" and insert -- 100% --, therefor.

Column 4
Line 31, Delete "poly(1,4-butadien)," and insert -- poly(1,4-butadiene), --, therefor.

Column 9
Line 8, After "estimated" insert -- $M_n$ --.

Signed and Sealed this
Twenty-fourth Day of December, 2019

Andrei Iancu
*Director of the United States Patent and Trademark Office*